(12) United States Patent
Huang et al.

(10) Patent No.: US 12,237,828 B2
(45) Date of Patent: Feb. 25, 2025

(54) FILTER MODULE WITH WIDENED PASSBAND

(71) Applicant: Skyworks Solutions, Inc., Irvine, CA (US)

(72) Inventors: Yulin Huang, Chengdu (CN); Gong Bin Tang, Moriguchi (JP); Kyohei Kobayashi, Otsu (JP)

(73) Assignee: Skyworks Solutions, Inc., Irvine, CA (US)

( * ) Notice: Subject to any disclaimer, the term of this patent is extended or adjusted under 35 U.S.C. 154(b) by 179 days.

(21) Appl. No.: 18/117,060

(22) Filed: Mar. 3, 2023

(65) Prior Publication Data

US 2023/0283261 A1    Sep. 7, 2023

Related U.S. Application Data

(60) Provisional application No. 63/316,601, filed on Mar. 4, 2022.

(51) Int. Cl.
*H01P 3/08* (2006.01)
*H03H 9/64* (2006.01)

(52) U.S. Cl.
CPC .............. *H03H 9/6483* (2013.01); *H01P 3/08* (2013.01)

(58) Field of Classification Search
CPC ................................. H03H 9/6483; H01P 3/08
See application file for complete search history.

(56) References Cited

U.S. PATENT DOCUMENTS

| | | | |
|---|---|---|---|
| 6,018,281 A | 1/2000 | Taguchi et al. | |
| 6,043,725 A | 3/2000 | Taguchi et al. | |
| 6,972,643 B2 | 12/2005 | Tsunekawa et al. | |
| 7,034,634 B2 | 4/2006 | Nakamura et al. | |
| 7,138,890 B2 | 11/2006 | Nakamura et al. | |
| 8,384,495 B2 | 2/2013 | Fujiwara et al. | |
| 8,994,420 B2 | 3/2015 | Eldredge et al. | |
| 9,035,725 B2 | 5/2015 | Komatsu et al. | |
| 9,154,114 B2 | 10/2015 | Ikeuchi | |
| 9,246,533 B2 | 1/2016 | Fujiwara et al. | |
| 9,294,071 B2 | 3/2016 | Yamaji et al. | |
| 9,520,857 B2 | 12/2016 | Fujiwara et al. | |
| 9,722,573 B2 | 8/2017 | Fujiwara et al. | |
| 9,722,574 B2 | 8/2017 | Ikeuchi | |
| 10,187,039 B2 | 1/2019 | Komatsu et al. | |
| 10,333,484 B2 | 6/2019 | Komatsu et al. | |
| 10,476,482 B2 | 11/2019 | Niwa et al. | |
| 10,491,194 B2 | 11/2019 | Komatsu et al. | |
| 10,727,844 B1 | 7/2020 | Gong et al. | |
| 10,749,497 B2 | 8/2020 | Tang et al. | |
| 10,826,507 B1 | 11/2020 | Gong et al. | |
| 10,873,313 B2 | 12/2020 | Zou et al. | |
| 11,050,406 B2 | 6/2021 | Maki et al. | |
| 11,245,378 B2 | 2/2022 | Tang et al. | |

(Continued)

*Primary Examiner* — Graham P Smith
(74) *Attorney, Agent, or Firm* — Knobbe, Martens, Olson & Bear, LLP

(57) ABSTRACT

Filter modules having a wider passband are provided herein. In certain embodiments, the filter module comprises an input node; an output node; a filter disposed along a signal path extending from the input node to the output node; a strip line configured to generate an inductance between the filter and a ground such to increase a bandwidth of a passband of the filter module, the single strip line disposed on multiple layers, each of the multiple layers defined by a plurality of pulse-shaped) portions of the strip line disposed on a plane.

25 Claims, 11 Drawing Sheets

(56) References Cited

U.S. PATENT DOCUMENTS

| | | |
|---|---|---|
| 11,411,552 B2 | 8/2022 | Komatsu |
| 11,522,514 B2 | 12/2022 | Zou et al. |
| 11,606,078 B2 | 3/2023 | Tang et al. |
| 11,616,491 B2 | 3/2023 | Tang et al. |
| 2004/0108918 A1 | 6/2004 | Tsunekawa et al. |
| 2004/0212450 A1 | 10/2004 | Nakamura et al. |
| 2006/0139126 A1 | 6/2006 | Nakamura et al. |
| 2011/0095845 A1 | 4/2011 | Fujiwara et al. |
| 2013/0187725 A1 | 7/2013 | Ikeuchi |
| 2013/0300467 A1 | 11/2013 | Eldredge et al. |
| 2014/0113571 A1 | 4/2014 | Fujiwara et al. |
| 2014/0285287 A1 | 9/2014 | Komatsu et al. |
| 2015/0180450 A1 | 6/2015 | Yamaji et al. |
| 2015/0372661 A1 | 12/2015 | Ikeuchi |
| 2016/0105158 A1 | 4/2016 | Fujiwara et al. |
| 2017/0093373 A1 | 3/2017 | Fujiwara et al. |
| 2017/0353174 A1 | 12/2017 | Komatsu et al. |
| 2018/0131344 A1 | 5/2018 | Komatsu et al. |
| 2018/0152191 A1 | 5/2018 | Niwa et al. |
| 2019/0074813 A1 | 3/2019 | Zou et al. |
| 2019/0149132 A1 | 5/2019 | Komatsu et al. |
| 2019/0357381 A1 | 11/2019 | Maki et al. |
| 2019/0379347 A1 | 12/2019 | Goto et al. |
| 2019/0379348 A1 | 12/2019 | Tang et al. |
| 2020/0028493 A1 | 1/2020 | Ta et al. |
| 2020/0358449 A1 | 11/2020 | Gong et al. |
| 2021/0050842 A1 | 2/2021 | Tang et al. |
| 2021/0058057 A1 | 2/2021 | Goto et al. |
| 2021/0058069 A1 | 2/2021 | Komatsu et al. |
| 2021/0067131 A1 | 3/2021 | Tang et al. |
| 2021/0067139 A1 | 3/2021 | Komatsu et al. |
| 2021/0099153 A1 | 4/2021 | Zou et al. |
| 2021/0111705 A1 | 4/2021 | Komatsu et al. |
| 2021/0152154 A1 | 5/2021 | Tang et al. |
| 2021/0159886 A1 | 5/2021 | Goto et al. |
| 2021/0281239 A1 | 9/2021 | Maki et al. |
| 2022/0014152 A1 | 1/2022 | Gebeyehu et al. |
| 2022/0123712 A1 | 4/2022 | Tang et al. |
| 2022/0200571 A1 | 6/2022 | Wang et al. |
| 2022/0200572 A1 | 6/2022 | Wang et al. |
| 2022/0271730 A1 | 8/2022 | Abbott et al. |
| 2022/0271733 A1 | 8/2022 | Abbott et al. |
| 2022/0271734 A1 | 8/2022 | Abbott et al. |
| 2022/0294421 A1 | 9/2022 | Wang et al. |
| 2022/0294422 A1 | 9/2022 | Wang et al. |
| 2022/0328980 A1 | 10/2022 | DiCarlo et al. |
| 2022/0399867 A1 | 12/2022 | Goto et al. |
| 2022/0399871 A1 | 12/2022 | Goto et al. |
| 2023/0006651 A1 | 1/2023 | Chen et al. |
| 2023/0013597 A1 | 1/2023 | Goto et al. |
| 2023/0026465 A1 | 1/2023 | Huang et al. |
| 2023/0028925 A1 | 1/2023 | Kobayashi |
| 2023/0031568 A1 | 2/2023 | Tang et al. |
| 2023/0043197 A1 | 2/2023 | Fujiwara et al. |
| 2023/0070350 A1 | 3/2023 | Goto et al. |
| 2023/0094376 A1 | 3/2023 | Fujiwara et al. |
| 2023/0098495 A1 | 3/2023 | Shin et al. |
| 2023/0099342 A1 | 3/2023 | Zou et al. |
| 2023/0101360 A1 | 3/2023 | Fujiwara et al. |
| 2023/0105726 A1 | 4/2023 | Tang et al. |
| 2023/0112677 A1 | 4/2023 | Tang et al. |

FILTER MODULE WITH WIDENED PASSBAND

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field

Embodiments of the invention relate to electronic systems, and in particular, to a filter module for use in radio frequency (RF) electronics.

Description of the Related Technology

Filters are used in radio frequency (RF) communication systems to allow signals to pass through at discreet frequencies but reject any frequency outside of the specified range. An acoustic wave filter, which is used widely in the wireless communication field, can include a plurality of resonators arranged to filter a radio frequency signal. Example acoustic wave filters include surface acoustic wave (SAW) filters and/or bulk acoustic wave (BAW) filters. A film bulk acoustic resonator (FBAR) filter is an example of a BAW filter. Acoustic wave filters can be implemented in radio frequency electronic systems. For instance, filters in a radio frequency front end of a mobile phone can include acoustic wave filters. A plurality of acoustic wave filters can be arranged as a multiplexer. For example, two surface acoustic wave filters can be arranged as a duplexer.

Examples of RF communication systems with one or more filter module include, but are not limited to, mobile phones, tablets, base stations, network access points, customer-premises equipment (CPE), laptops, and wearable electronics. For example, in wireless devices that communicate using a cellular standard, a wireless local area network (WLAN) standard, and/or any other suitable communication standard, a power amplifier can be used for RF signal amplification. An RF signal can have a frequency in the range of about 30 kHz to 300 GHz, such as in the range of about 410 MHz to about 7.125 GHz for certain communications standards.

DETAILED DESCRIPTION OF EMBODIMENTS

Figure 1:
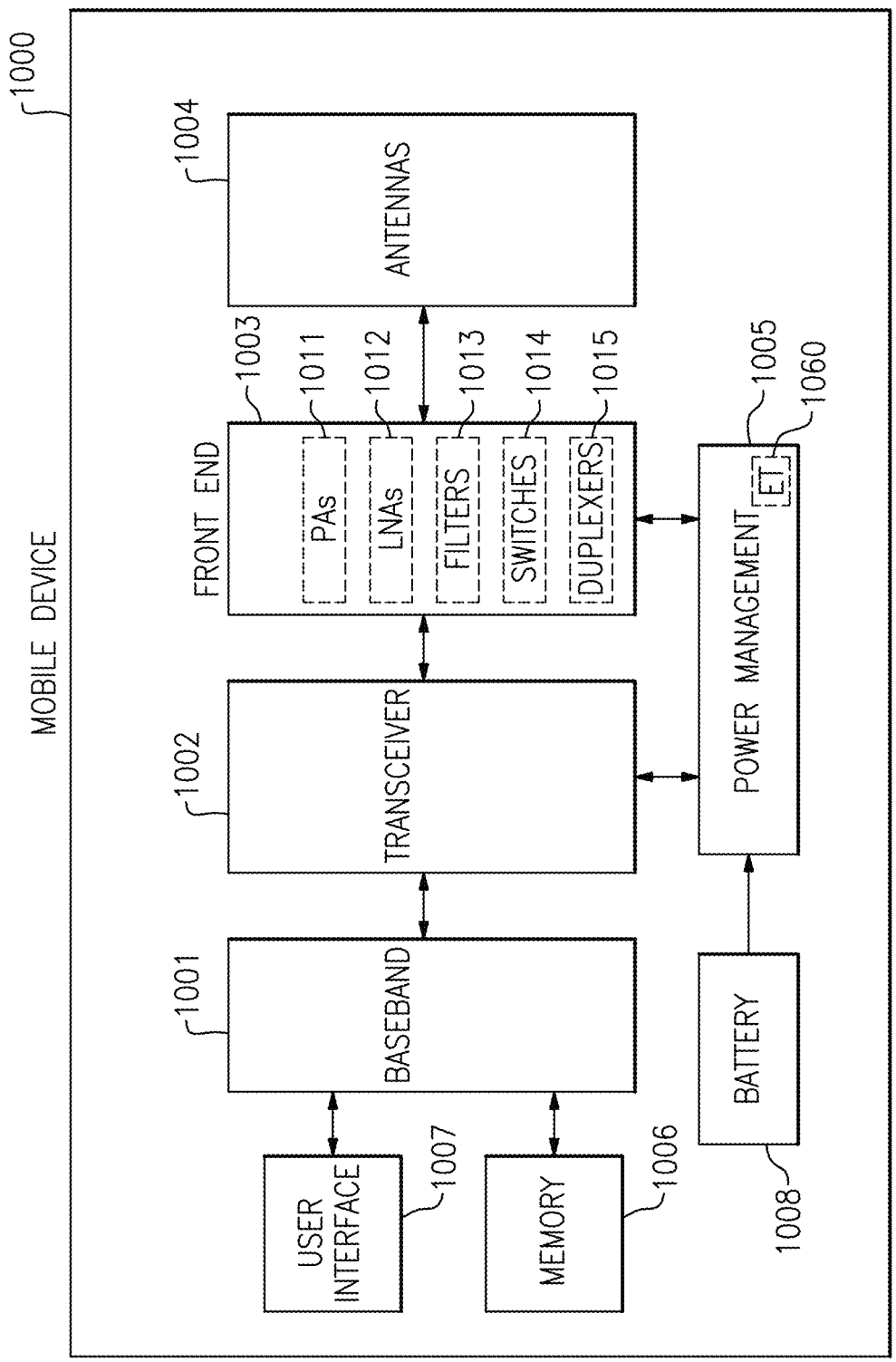
FIG. 1 is a schematic diagram of one embodiment of a mobile device.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

FIG. 1 is a schematic diagram of one example of a mobile device 100.

The mobile device 100 includes a baseband system 101, a transceiver 102, a front end system 103, antennas 104, a power management system 105, a memory 106, a user interface 107, and a battery 108.

The mobile device 100 can be used communicate using a wide variety of communications technologies, including, but not limited to, 2G, 3G, 4G (including LTE, LTE-Advanced, and LTE-Advanced Pro), 5G, WLAN (for instance, Wi-Fi), WPAN (for instance, Bluetooth and ZigBee), WMAN (for instance, WiMax), and/or GPS technologies.

The transceiver 102 generates RF signals for transmission and processes incoming RF signals received from the antennas 104. It will be understood that various functionalities associated with the transmission and receiving of RF signals can be achieved by one or more components that are collectively represented in FIG. 1 as the transceiver 102. In one example, separate components (for instance, separate circuits or dies) can be provided for handling certain types of RF signals.

The front end system 103 aids in conditioning signals transmitted to and/or received from the antennas 104. In the illustrated embodiment, the front end system 103 includes power amplifiers (PAs) 111, low noise amplifiers (LNAs) 112, filters 113, switches 114, and duplexers 115. However, other implementations are possible.

For example, the front end system 103 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 100 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band and/or in different bands.

The antennas 104 can include antennas used for a wide variety of types of communications. For example, the antennas 104 can include antennas associated transmitting and/or receiving signals associated with a wide variety of frequencies and communications standards.

In certain implementations, the antennas 104 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 100 can operate with beamforming in certain implementations. For example, the front end system 103 can include phase shifters having variable phase controlled by the transceiver 102. Additionally, the phase shifters are controlled to provide beam formation and directivity for transmission and/or reception of signals using the antennas 104. For example, in the context of signal transmission, the phases of the transmit signals provided to the antennas 104 are controlled such that radiated signals from the antennas 104 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 104 from a particular direction. In certain implementations, the antennas 104 include one or more arrays of antenna elements to enhance beamforming.

The baseband system 101 is coupled to the user interface 107 to facilitate processing of various user input and output (I/O), such as voice and data. The baseband system 101 provides the transceiver 102 with digital representations of transmit signals, which the transceiver 102 processes to generate RF signals for transmission. The baseband system 101 also processes digital representations of received signals provided by the transceiver 102. As shown in FIG. 1, the baseband system 101 is coupled to the memory 106 of facilitate operation of the mobile device 100.

The memory 106 can be used for a wide variety of purposes, such as storing data and/or instructions to facilitate the operation of the mobile device 100 and/or to provide storage of user information.

The power management system 105 provides a number of power management functions of the mobile device 100. The power management system 105 of FIG. 1 includes an envelope tracker 160. As shown in FIG. 1, the power management system 105 receives a battery voltage form the battery 108. The battery 108 can be any suitable battery for use in the mobile device 100, including, for example, a lithium-ion battery.

The mobile device 100 of FIG. 1 illustrates one example of an RF communication system that can include power amplifier(s) implemented in accordance with one or more features of the present disclosure. However, the teachings herein are applicable to RF communication systems implemented in a wide variety of ways.

Figure 2A:
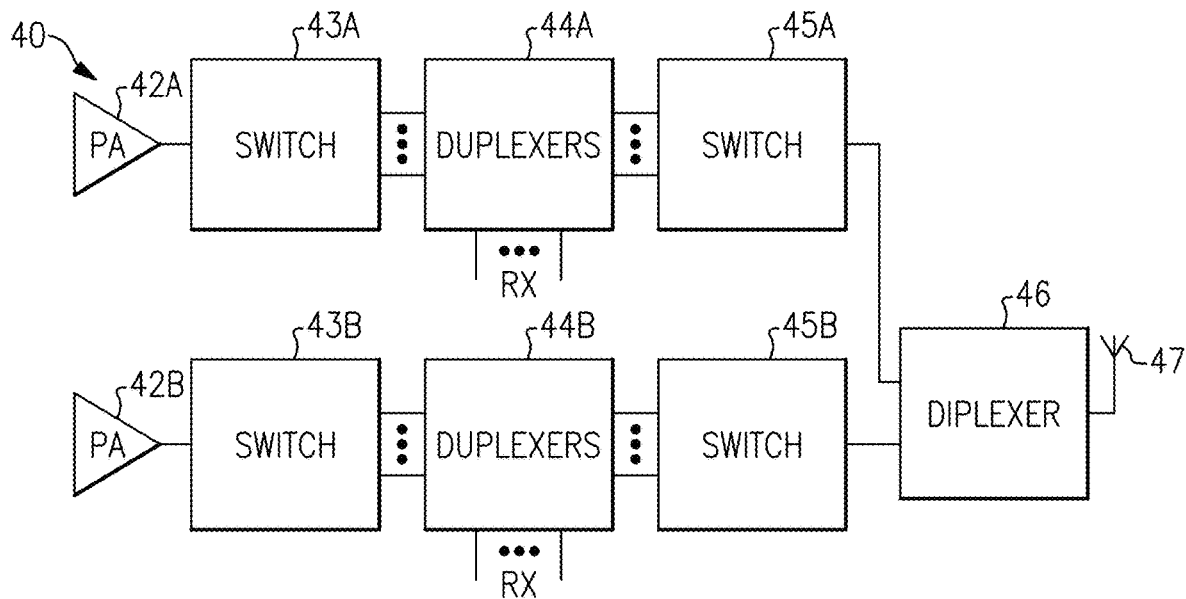
FIG. 2A is a schematic diagram of one embodiment of a carrier aggregation system.

FIG. 2A is a schematic diagram of a carrier aggregation system 40. The illustrated carrier aggregation system 40 includes power amplifiers 42A and 42B, switches 43A and 43B, duplexers 44A and 44B, switches 45A and 45B, diplexer 46, and antenna 47. The power amplifiers 42A and 42B can each transmit an amplified RF signal associated with a different carrier. The switch 43A can be a band select switch. The switch 43A can couple an output of the power amplifier 42A to a selected duplexer of the duplexers 44A. Each of the duplexers can include a transmit filter and receive filter. Any of the filters of the duplexers 44A and 44B can be implemented in accordance with any suitable principles and advantages discussed herein. The switch 45A can couple the selected duplexer of the duplexers 44A to the diplexer 46. The diplexer 46 can combine RF signals provided by the switches 45A and 45B into a carrier aggregation signal that is transmitted by the antenna 47. The diplexer 46 can isolate different frequency bands of a carrier aggregation signal received by the antenna 47. The diplexers 46 is an example of a frequency domain multiplexer. Other frequency domain multiplexers include a triplexer. Carrier aggregation systems that include triplexers can process carrier aggregation signals associated with three carriers. The switches 45A and 45B and selected receive filters of the duplexers 44A and 44B can provide RF signals with the isolated frequency bands to respective receive paths.

Figure 2B:
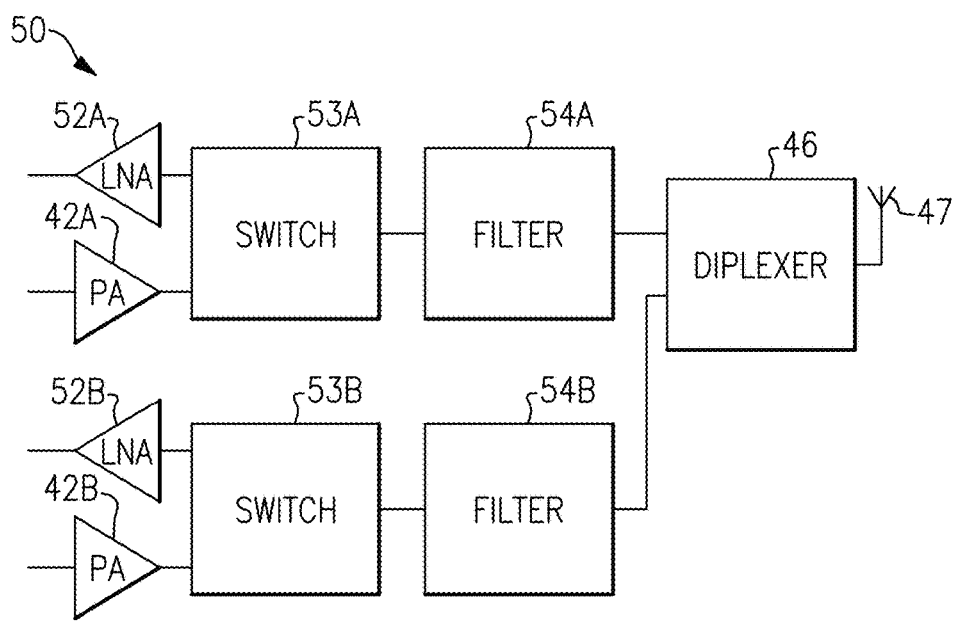
FIG. 2B is a schematic diagram of one embodiment of a carrier aggregation system.

FIG. 2B is a schematic diagram of a carrier aggregation system 50. The illustrated carrier aggregation system 50 includes power amplifiers 42A and 42B, low noise amplifiers 52A and 52B, switches 53A and 53B, filters 54A and 54B, diplexer 46, and antenna 47. The power amplifiers 42A and 42B can each transmit an amplified RF signal associated with a different carrier. The switch 53A can be a transmit/receive switch. The switch 53A can couple the filter 54A to an output of the power amplifier 42A in a transmit mode and to an input of the low noise amplifier 52A in a receive mode. The filter 54A and/or the filter 54B can be implemented in accordance with any suitable principles and advantages discussed herein. The diplexer 46 can combine RF signals from the power amplifiers 42A and 42B provided by the switches 53A and 53B into a carrier aggregation signal that is transmitted by the antenna 47. The diplexer 46 can isolate different frequency bands of a carrier aggregation signal received by the antenna 47. The switches 53A and 53B and the filters 54A and 54B can provide RF signals with the isolated frequency bands to respective low noise amplifiers 52A and 52B.

Figure 2C:
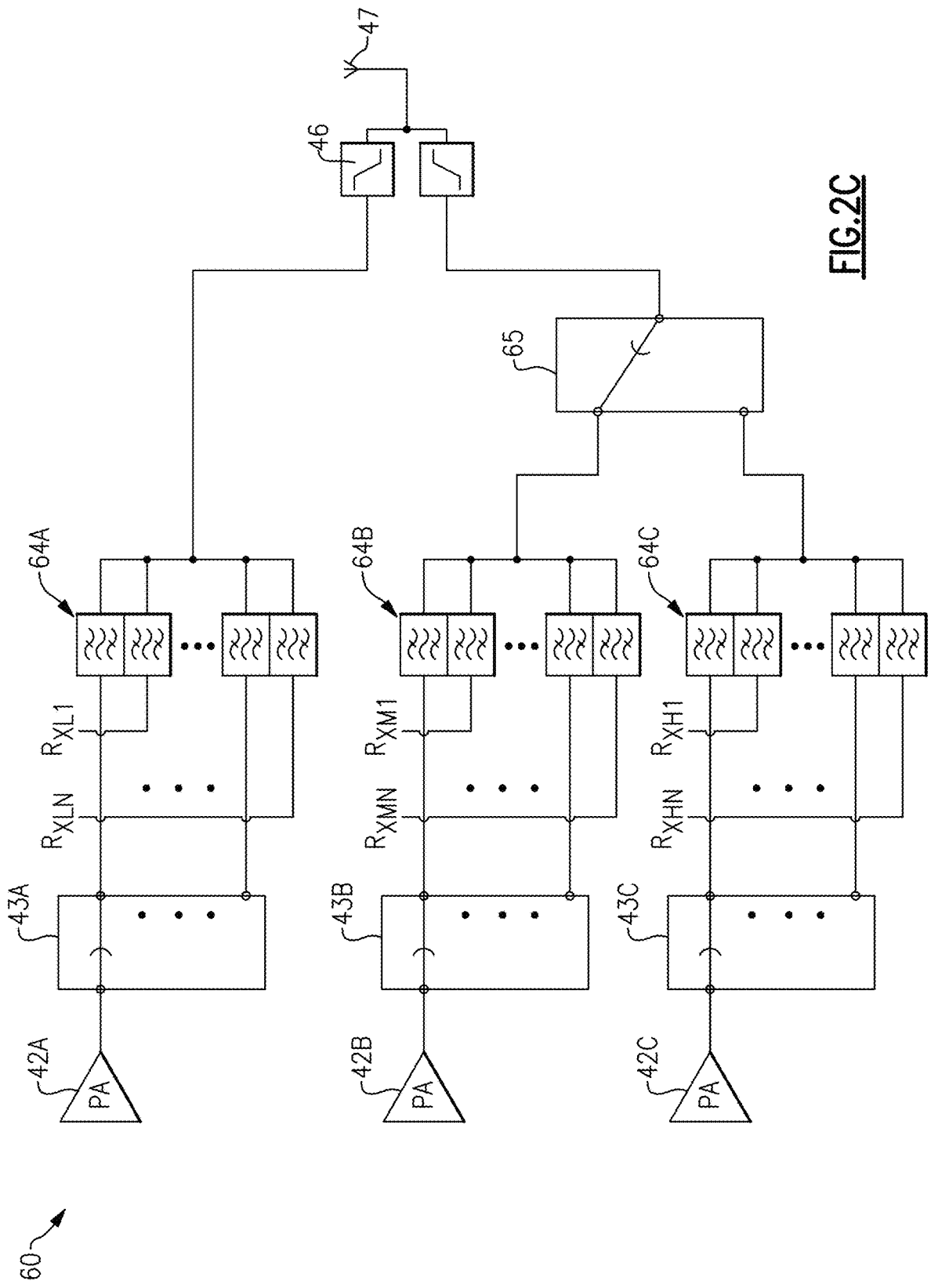
FIG. 2C is a schematic diagram of one embodiment of a carrier aggregation system.

FIG. 2C is a schematic diagram of a carrier aggregation system 60 that includes multiplexers in signal paths between power amplifiers and an antenna. The illustrated carrier aggregation system 60 includes a low band path, a medium band path, and a high band path. In certain applications, a low band path can process radio frequency signals having a frequency of less than 1 GHz, a medium band path can process radio frequency signals having a frequency between 1 GHz and 2.2 GHz, and a high band path can process radio frequency signals having a frequency above 2.2 GHz.

A diplexer 46 can be included between RF signal paths and an antenna 47. The diplexer 46 can frequency multiplex radio frequency signals that are relatively far away in frequency. The diplexer 46 can be implemented with passive circuit elements having a relatively low loss. The diplexer 46 can combine (for transmit) and separate (for receive) carriers of carrier aggregation signals.

As illustrated, the low band path includes a power amplifier 42A configured to amplify a low band radio frequency signal, a band select switch 43A, and a multiplexer 64A. The band select switch 43A can electrically connect the output of the power amplifier 42A to a selected transmit filter of the multiplexer 64A. The selected transmit filter can be a band pass filter with pass band corresponding to a frequency of an output signal of the power amplifier 42A. The multiplexer 64A can include any suitable number of transmit filters and any suitable number of receive filters. One or more of the transmit filters and/or one or more of the receive filters can be implemented in accordance with any suitable principles and advantages discussed herein. The multiplexer 64A can have the same number of transmit filters as receive filters. In some instances, the multiplexer 64A can have a different number of transmit filters than receive filters.

As illustrated in FIG. 2C, the medium band path includes a power amplifier 42B configured to amplify a medium band radio frequency signal, a band select switch 43B, and a multiplexer 64B. The band select switch 43B can electrically connect the output of the power amplifier 42B to a selected transmit filter of the multiplexer 64B. The selected transmit filter can be a band pass filter with pass band corresponding to a frequency of an output signal of the power amplifier 42B. The multiplexer 64B can include any suitable number of transmit filters and any suitable number of receive filters. One or more of the transmit filters and/or one or more of the receive filters can be implemented in accordance with any suitable principles and advantages discussed herein. The multiplexer 64B can have the same number of transmit filters as receive filters. In some instances, the multiplexer 64B can have a different number of transmit filters than receive filters.

In the illustrated carrier aggregation system 60, the high band path includes a power amplifier 42C configured to amplify a high band radio frequency signal, a band select switch 43C, and a multiplexer 64C. The band select switch 43C can electrically connect the output of the power amplifier 42C to a selected transmit filter of the multiplexer 64C. The selected transmit filter can be a band pass filter with pass band corresponding to a frequency of an output signal of the power amplifier 42C. The multiplexer 64C can include any suitable number of transmit filters and any suitable number of receive filters. One or more of the transmit filters and/or one or more of the receive filters can be implemented in accordance with any suitable principles and advantages discussed herein. The multiplexer 64C can have the same number of transmit filters as receive filters. In some instances, the multiplexer 64C can have a different number of transmit filters than receive filters.

A select switch 65 can selectively provide a radio frequency signal from the medium band path or the high band path to the diplexer 46. Accordingly, the carrier aggregation system 60 can process carrier aggregation signals with either a low band and high band combination or a low band and medium band combination.

Figure 2D:
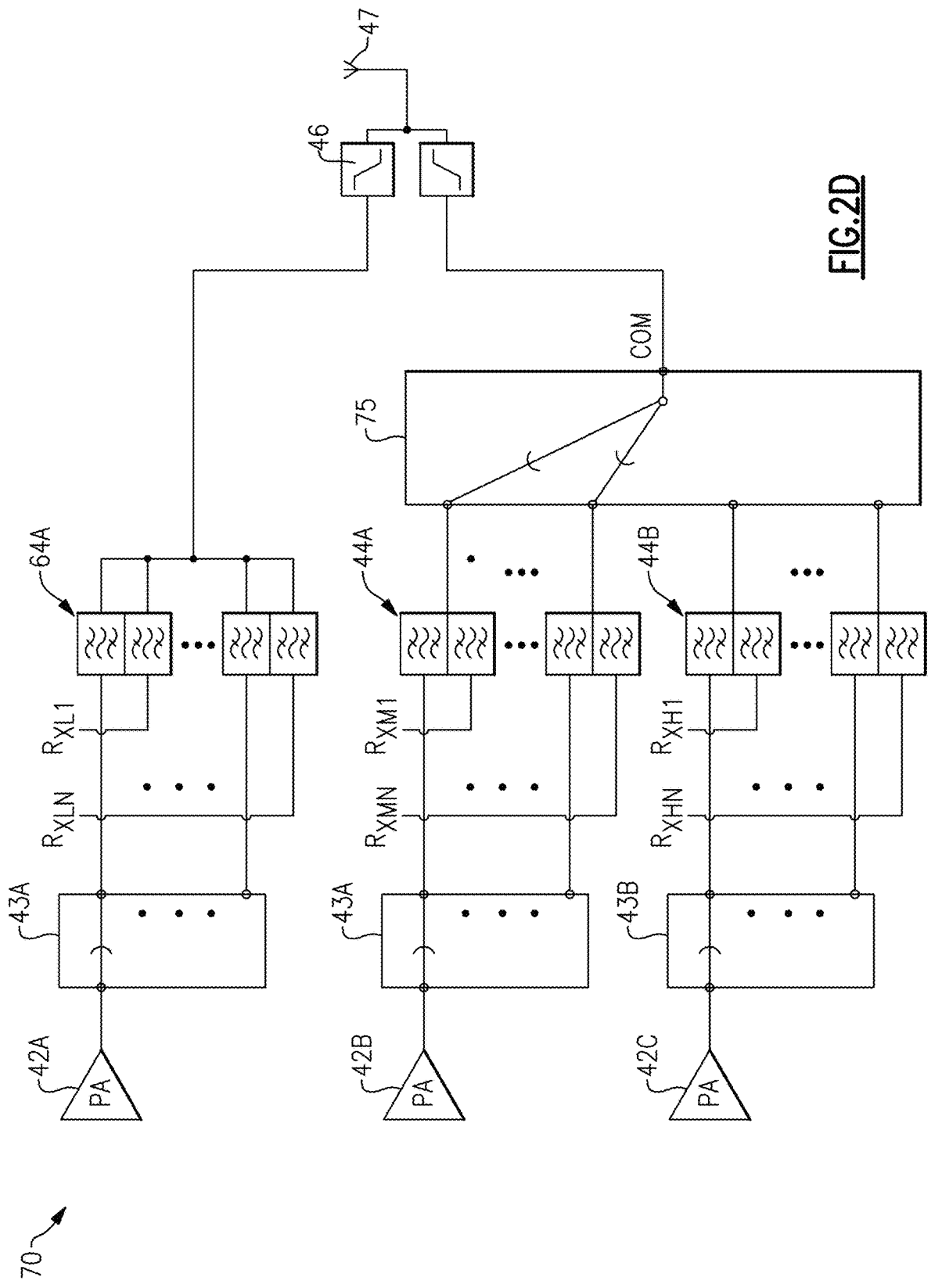
FIG. 2D is a schematic diagram of one embodiment of a carrier aggregation system.

FIG. 2D is a schematic diagram of a carrier aggregation system 70 that includes multiplexers in signal paths between power amplifiers and an antenna. The carrier aggregation system 70 is like the carrier aggregation system 60 of FIG. 2C, except that the carrier aggregation system 70 includes switch-plexing features. Switch-plexing can be implemented in accordance with any suitable principles and advantages discussed herein.

Switch-plexing can implement on-demand multiplexing. Some radio frequency systems can operate in a single carrier mode for a majority of time (e.g., about 95% of the time) and in a carrier aggregation mode for a minority of the time (e.g., about 5% of the time). Switch-plexing can reduce loading in a single carrier mode in which the radio frequency system can operate for the majority of the time relative to a multiplexer that includes filters having a fixed connection at a common node. Such a reduction in loading can be more significant when there are a relatively larger number of filters included in multiplexer.

In the illustrated carrier aggregation system 70, duplexers 64B and 64C are selectively coupled to a diplexer 46 by way of a switch 75. The switch 75 is configured as a multi-close switch that can have two or more throws active concurrently. Having multiple throws of the switch 75 active concurrently can enable transmission and/or reception of carrier aggregation signals. The switch 75 can also have a single throw active during a single carrier mode. As illustrated, each duplexer of the duplexers 44A coupled to separate throws of the switch 75. Similarly, the illustrated duplexers 44B include a plurality of duplexers coupled to separate throws of the switch 75. Alternatively, instead of duplexers being coupled to each throw the switch 75 as illustrated in FIG. 2D, one or more individual filters of a multiplexer can be coupled to a dedicated throw of a switch coupled between the multiplexer and a common node. For instance, in some applications, such a switch could have twice as many throws as the illustrated switch 75.

Figure 3A:
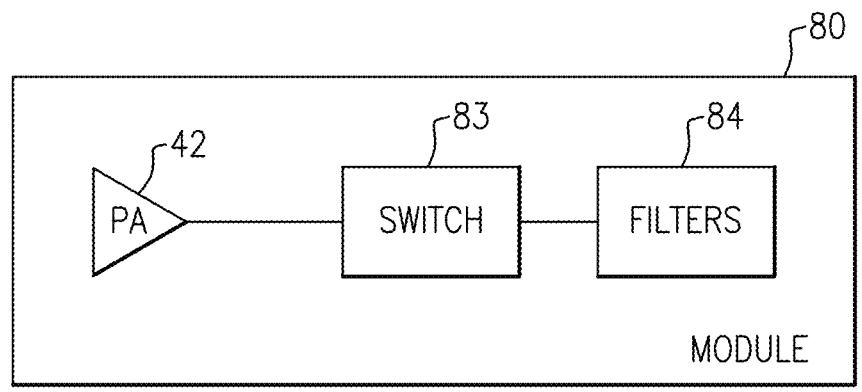
FIG. 3A is a schematic block diagram of a module that includes a filter according to an embodiment.
Figure 3B:
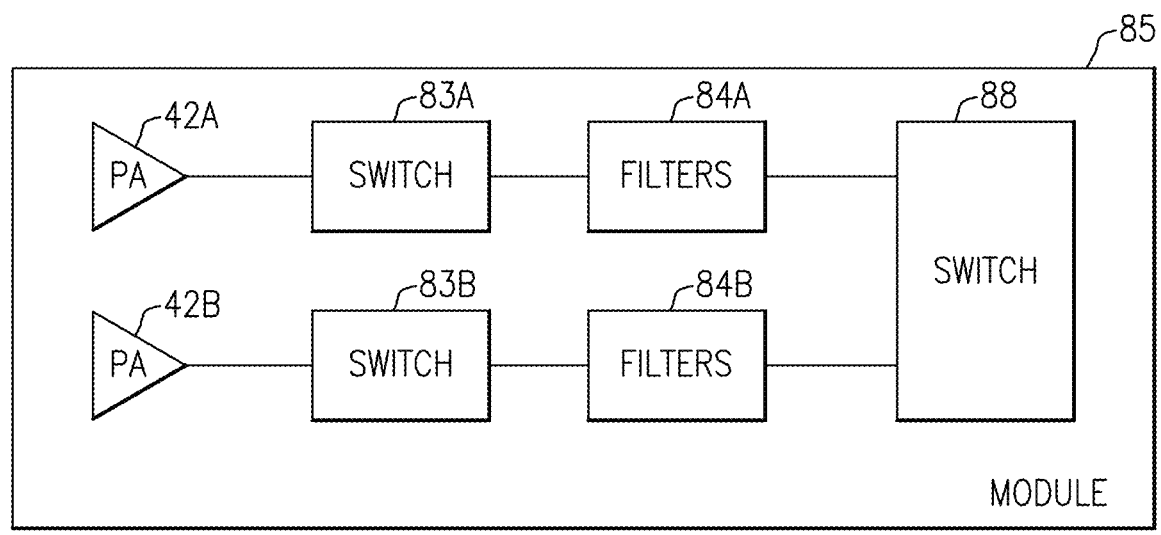
FIG. 3B is a schematic block diagram of a module that includes a filter according to an embodiment.

The filters discussed herein can be implemented in a variety of packaged modules. Some example packaged modules will now be discussed in which any suitable principles and advantages of the filters discussed herein can be implemented. FIGS. 3A and 3B are schematic block diagrams of illustrative packaged modules according to certain embodiments.

FIG. 3A is a schematic block diagram of a module 80 that includes a power amplifier 42, a switch 83, and filters 84 in accordance with one or more embodiments. The module 80 can include a package that encloses the illustrated elements. The power amplifier 42, a switch 83, and filters 84 can be disposed on a common packaging substrate. The packaging substrate can be a laminate substrate, for example. The switch 83 can be a multi-throw radio frequency switch. The switch 83 can electrically couple an output of the power amplifier 42 to a selected filter of the filters 84. The filters 84 can include any suitable number of surface acoustic wave filters. One or more filters of the filters 84 can be implemented in accordance with any suitable principles and advantages disclosed herein.

FIG. 3B is a schematic block diagram of a module 85 that includes power amplifiers 42A and 42B, switches 83A and 83B, and filters 84A and 84B in accordance with one or more embodiments, and an antenna switch 88. One or more filters of the filters 84A and/or 84B can be implemented in accordance with any suitable principles and advantages disclosed herein. The additional RF signal path includes an additional power amplifier 42B, and additional switch 83B, and additional filters 84B. The different RF signal paths can be associated with different frequency bands and/or different modes of operation (e.g., different power modes, different signaling modes, etc.).

Radio-frequency (RF) filters, for example, based on SAW resonators on piezoelectric materials such as LiNbO3 or LiTaO3 have been widely used in mobile communications owing to their excellent characteristics, including small size, low insertion two SAW resonators connected in series and parallel arms, and is designed such that the anti-resonance frequency ($f_a$) of the parallel arm resonator and the resonance frequency ($f_r$) of the series arm resonator nearly coincide, while notches are located at $f_r$ of the parallel resonator and $f_a$ of the series resonator.

The bandwidth of a SAW filter is governed by its mechanical-electrical coupling coefficient, $K^2$. The value of $K^2$, as a measure of the electro-acoustic energy conversion efficiency of a resonator, can be estimated using the following Formula 1 derived from equivalent circuit analysis:

$$K^2=(\pi f_r/2f_a)/\tan(\pi f_r/2f_a)$$ [Formula 1]

Therefore, a large $K^2$ indicates a large difference between $f_r$ and $f_a$, which is of great importance for achieving wideband SAW filters.

However, the value of $K^2$ is limited by the choice of substrate material. To obtain a wider passband without using new materials, the peripheral coil inductor is usually cascaded with a SAW resonator to provide additional inductance so that the distance between SAW resonance and anti-resonance frequency increases.

Figure 4:
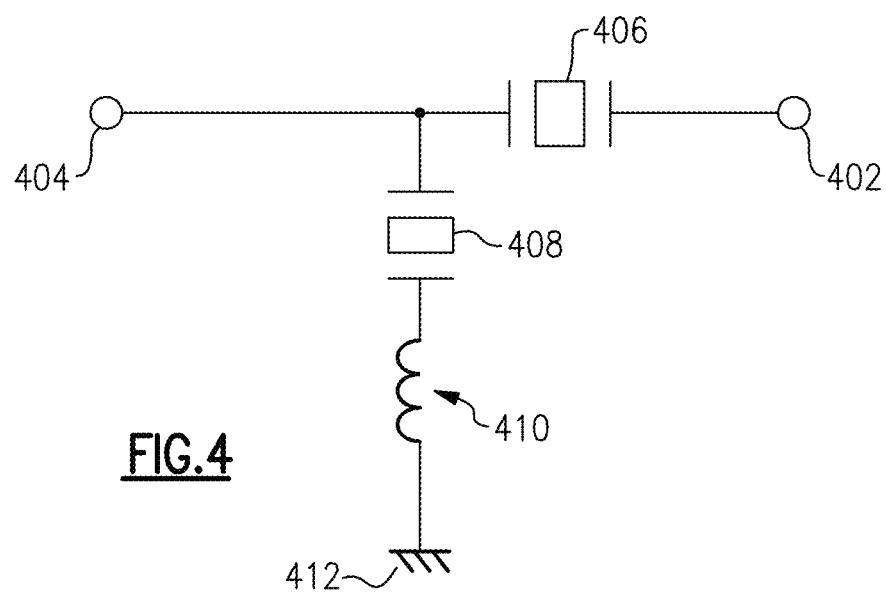
FIG. 4 is a schematic diagram of a filter module according to an embodiment.

FIG. 4 is a schematic diagram of a filter module. The filter module includes an input node 402, an output node 404, a series resonator 406, a shunt resonator 408, and a coil inductor 410 disposed between the shunt resonator 408 and a ground 412.

However, the coil inductor 402 occupies large size and is difficult to integrate. Therefore, it is desirable to develop a filter module with wider passband ($K^2$) that does not require change of materials and does not occupy more space.

Figure 5:
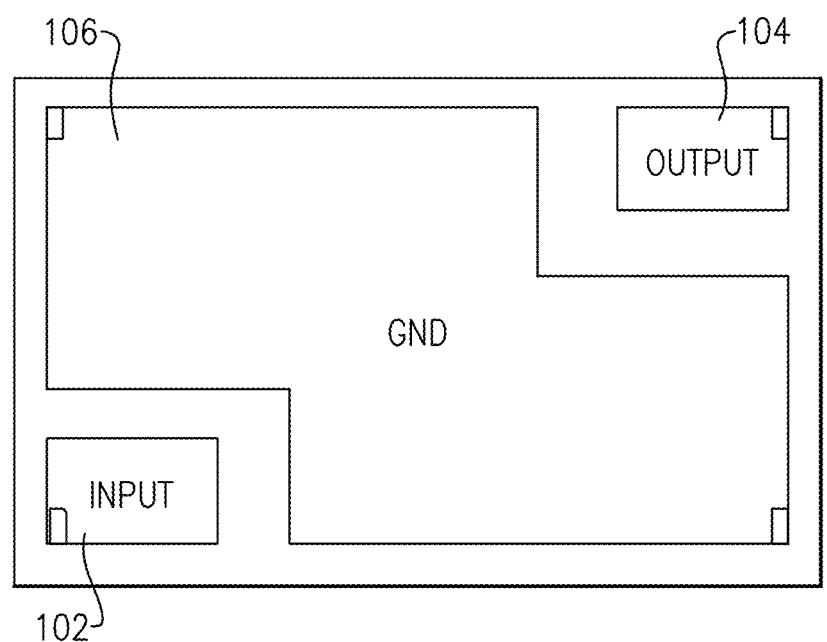
FIG. 5 is a schematic diagram of an exemplary filter module.

FIG. 5 is a schematic diagram of an exemplary comparative filter module 100. As shown in FIG. 5, the filter module 100 includes an input node 102, an output node 104, and a ground node 106.

The filter module 100 may further include a filter (not shown) disposed along a signal path extending from the input node 102 to the output node 104. The filter may have a structure illustrated in FIG. 4. For example, the filter may include a series resonator and a shunt resonator disposed between the series resonator and the ground.

Figure 6:
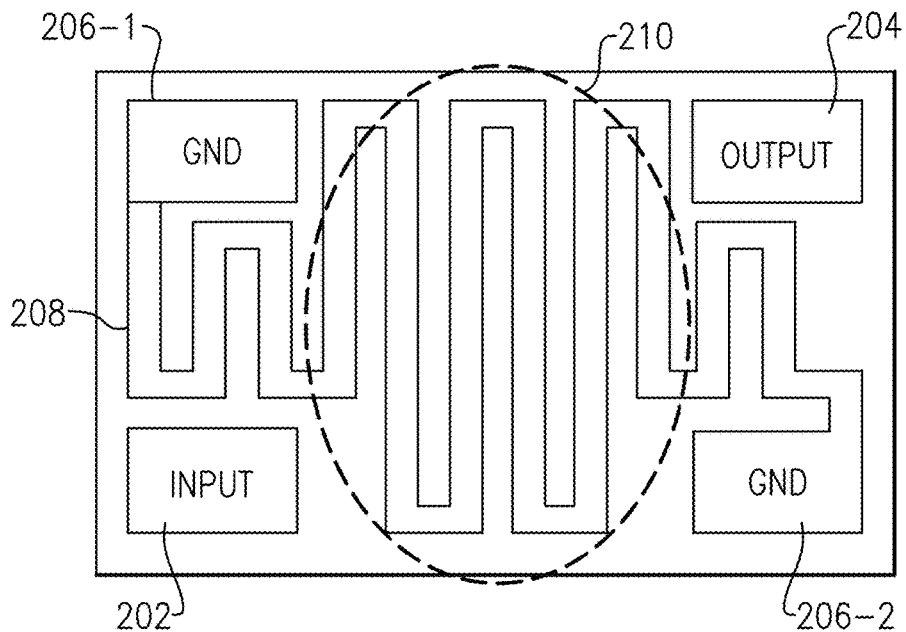
FIG. 6 is a schematic diagram of one embodiment of a filter module including a strip line disposed on a single layer.

FIG. 6 is a schematic diagram of a filter module 200 including a strip line disposed on a single layer. As shown in FIG. 6, the filter module 200 includes an input node 202, an output node 204, a first ground node 206-1, a second ground node 206-2, and a strip line 208.

The filter module 200 may further include a filter (not shown) disposed along a signal path extending from the input node 202 to the output node 204. The filter may have a structure as illustrated in FIG. 4. For example, the filter may include a series resonator and a shunt resonator disposed between the series resonator and the ground. The ground may be at least one of the first ground node 206-1 and the second ground node 206-2.

The strip line 208 is configured to generate an inductance between the filter and the ground. The inductance generated by the strip line 208 is configured to increase the difference between a resonance frequency and an anti-resonance frequency of the filter. More specifically, the inductance increases the difference between a resonance frequency and an anti-resonance frequency of the series resonator and/or the shunt resonator included in the filter. The increased difference between a resonance frequency and an anti-resonance frequency contributes to achieve a wider passband of the filter module 200.

The strip line 208 is disposed to connect the first ground node 206-1 and the second ground node 206-2. The strip line 208 includes a plurality of pulse-shaped portions 210. The pulse shape may be a rectangle pulse shape or a curved pulse shape.

According to the filter module 200 including a strip line disposed on a single layer, the bandwidth of passband is increased by 1-10% of the desired value (increased by 0.7% compared to the comparative filter module of FIG. 4 without a strip line). Therefore, a filter module with an even more widened passband is provided according to an embodiment of the present disclosure.

Figure 7A:
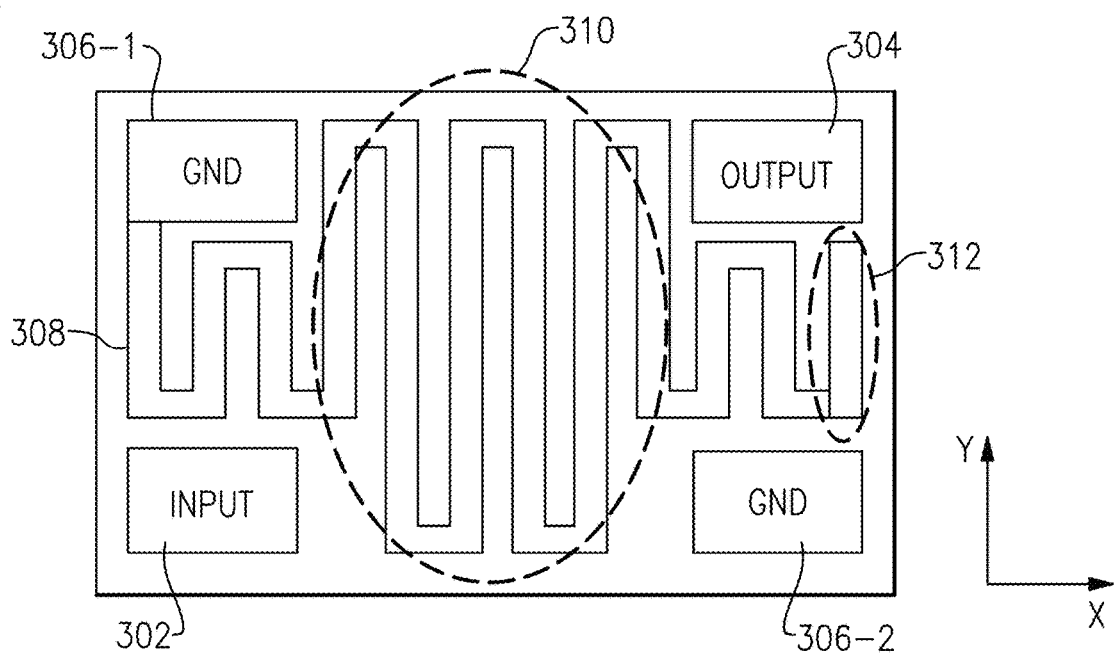
FIG. 7A is a schematic diagram of a lowest layer (first layer) of the strip line included in the filter module of FIG. 6.
Figure 7B:
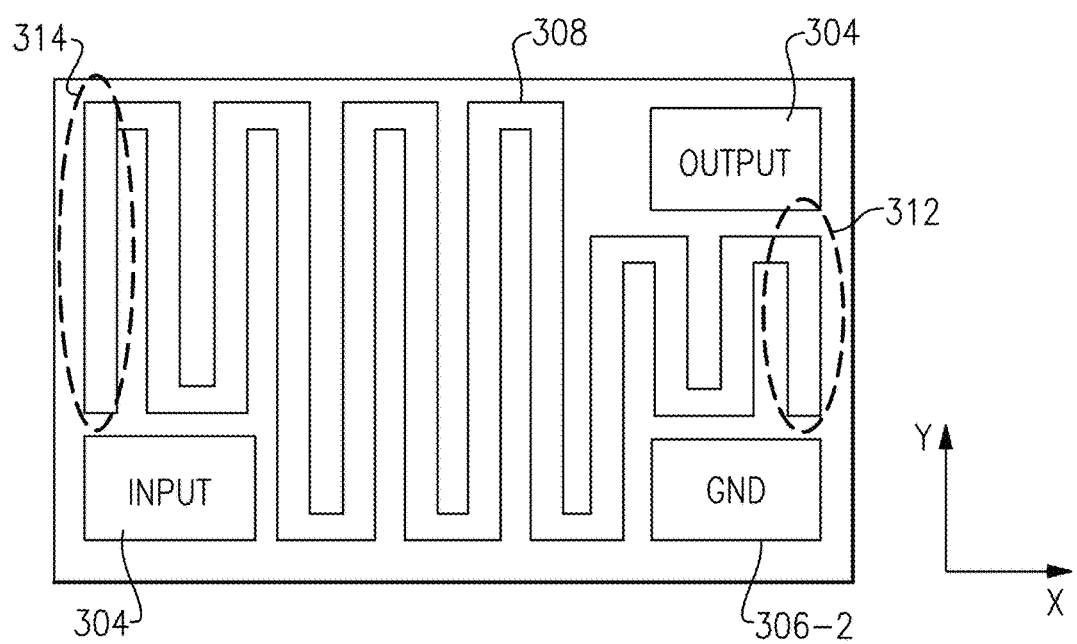
FIG. 7B is a schematic diagram of a second layer of strip line included in the filter module of FIG. 6.
Figure 7C:
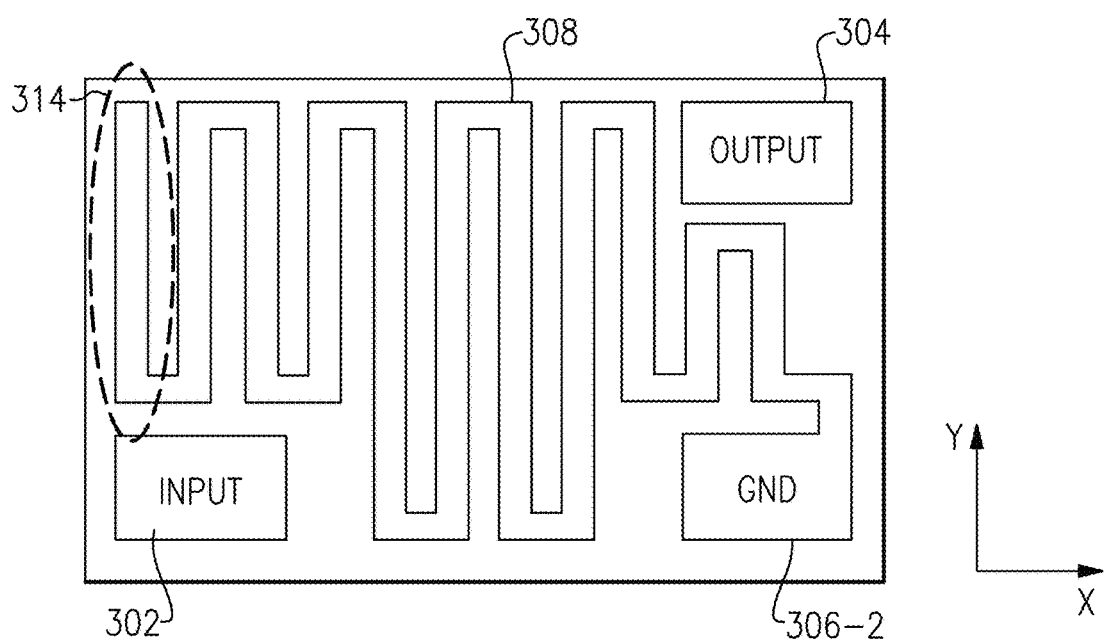
FIG. 7C is a schematic diagram of a third layer of strip line included in the filter module of FIG. 6.

FIGS. 7A-7C are schematic diagrams of a filter module 300 including a single strip line disposed on multiple layers. According to an embodiment, a bandwidth of passband of the filter module can be efficiently increased by adding additional inductive strip lines, which are formed on multiple copper layers of the package.

FIG. 7A is a schematic diagram of a lowest layer (first layer) of the strip line 308 included in the filter module 300. As shown in FIG. 7A, the filter module 300 includes an input node 302, an output node 304, and a strip line 308. The strip line 308 is disposed between a first ground node 306-1 and a second ground node 306-2. In FIG. 7A, since it is a first layer of the strip line 308, the strip line 308 is drawn to be connected only to the first ground node 306-1, but not to the second ground node 306-2. The first ground node 306-1 and the second ground node 306-2 have a voltage value same as the ground. It goes without saying that the strip line 308 is not shorted itself at a point along the strip line 308.

The filter module 300 may further include a filter (not shown) disposed along a signal path extending from the input node 202 to the output node 204. The filter may have a structure as illustrated in FIG. 4. For example, the filter may include a series resonator and a shunt resonator disposed between the series resonator and the ground. The ground may be at least one of the first ground node 306-1 and the second ground node 306-2. However, the inner structure of the filter is not limited thereto. For example, the filter is a ladder type filter such to include a plurality of series resonators and a plurality of shunt resonators.

The strip line 308 is configured to generate an inductance between the filter and the ground. The strip line 308 may be formed of copper. The inductance generated by the strip line 308 is configured to increase difference between a resonance frequency and an anti-resonance frequency of the filter. More specifically, the inductance increases the difference between a resonance frequency and an anti-resonance frequency of the series resonator and/or the shunt resonator included in the filter. The increased difference between a resonance frequency and an anti-resonance frequency contributes to achieve a wider passband of the filter module 300.

The strip line 308 includes a plurality of pulse-shaped portions 310. The pulse shaped portion of the strip line 308 may be a rectangular pulse shape or a curved pulse shape. The arrangement of the strip line 308 can be determined to use the whole available space inside the filter module. More specifically, the strip line 308 is arranged such that at least a part of the outer boundary of the plurality of pulse-shaped portions 310 is disposed in the vicinity of a frame of the filter module 300. In other words, the area occupied by the strip line 308 may be selected to be as large as possible.

The term 'layer' in this description can be defined by a plurality of pulse-shaped portions 310 of the strip line 308 disposed on a single plane. In other words, a single plane includes the pulse shaped portions 310 of the strip line 308 can be defined as a layer.

The width of the strip line 308 may be constant in at least one portion of the strip line 308. For example, a width of the strip line 308 in a same straight line may be constant. For example, the width of the whole strip line 308 may be constant. The width of the strip line 308 on each location may be adjusted depending on the desired performance of the filter module 300.

The gap distance between a straight line and an adjacent straight line, e.g. adjacent parallel lines, may be constant. Alternatively, the gap distance between the adjacent parallel lines may be different depending on its location inside the filter module 300. The gap distance on each location may be adjusted depending on the desired performance of the filter module 300.

According to an embodiment, the strip line 308 is arranged such that at least a part of the outer boundary of the plurality of pulse-shaped portions 310 is disposed in the vicinity of a frame of the filter module 300. For example, as illustrated in FIG. 7A, the strip line 308 starts from the first ground node 306-1, and extends towards an -y direction. Once there is no more space to extend due to other elements (such as for example input node 302) inside the filter module 300 or a frame of the filter module 300, the strip line 308 turns towards the +x direction. The strip line 308 extends towards +x direction until it is far enough to have the predetermined gap distance with adjacent parallel line, and then it turns again towards the +y direction such to draw the adjacent parallel line. In this manner, the strip line 308 may be arranged to fully use the whole available area inside the filter module 300. In FIG. 7A, it is illustrated that the strip line 308 in arranged in x or y direction, but it is not limited thereto.

The strip line 308 includes at least one connecting portion. The connection portion 312 connects one layer of the strip line 308 to another adjacent layer of the strip line 308. The connecting portion 312 of the strip line 308 is a vertical copper strip. The connecting portion 312 may be formed of same material to that of the pulse shaped portions 310. Alternatively, the connecting portion 312 may be formed of different material from that of the pulse shaped portions 310 of the strip line 308. In this case, the material can be selected depending on its location and its purpose, for example enhancing durability. In FIG. 7, the connecting portion 312 of the strip line 308 connects to the second layer of the strip line 308.

FIG. 7B is a schematic diagram of a second layer of strip line included in the filter module 300. As shown in FIG. 7B, the strip line 308 starts from the connecting portion 312. For the purpose of clear distinction, the connecting portion 312 is now referred to as a first connecting portion. The strip line 308, on the second layer, extends from the first connecting portion 312 to a second connecting portion 314.

The arrangement of the strip line 308 on second layer is identical to that of the first layer. The alignment of the strip line 308 on the second layer with respect to the strip line on the first layer is also not limited, as long as the strip line 308 uses substantially the whole available area inside the filter module 300. In more detail, the strip line 308 can be disposed on upper side of the first ground node 306-1 in order to occupy the space as much as possible.

In FIG. 7B, since it is a second layer, the strip line is drawn not to be connected any one of the first ground node 306-1 and the second ground node 306-2. The second connecting portion 314 connects the strip line 308 to a third layer.

FIG. 7C is a schematic diagram of a third layer of strip line included in the filter module 300. On the third layer, the strip line 308 starts from the second connecting portion 314 which is connected from the second layer.

The arrangement of the strip line 308 on third layer is identical to that of the second layer. The alignment of the strip line 308 on the third layer with respect to the strip line on the second layer is also not limited, as long as the strip line 308 uses the whole available area inside the filter module 300. In more detail, the strip line 308 can be disposed on upper side of the first ground node 306-1 in order to occupy the space as much as possible.

The strip line 308 is eventually connected to the second ground node 306-2. In this description, the number of the multiple layers is 3, but the number of the layers is not limited thereto. Once the chip has a margin, more layers can be added.

According to embodiments of the present disclosure, the filter module 300 has a bandwidth of passband increased by 3% without changing the chip size (x and y direction). The multiple layers of the strip line provides unlimited inductance once the chip has margin in height direction (perpendicular to both x and y directions).

Figure 8A:
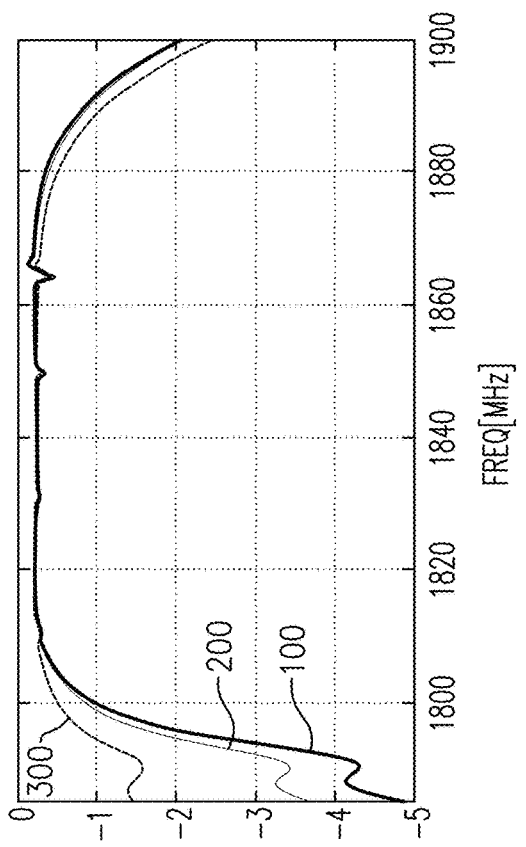
FIG. 8A is a measured bandwidths of one embodiment of a filter module without strip line, a filter module with a strip line on a single layer, and a filter module with a single strip line on multiple layers.

FIG. 8A is a measured bandwidths of filter module 100 without strip line, a filter module 200 with a strip line on a single layer, and a filter module 300 with a single strip line on multiple layers.

As shown in FIG. 8A, the filter module 200 with a strip line on a single layer has a wider bandwidth of passband (95.32 MHz) than that of filter module 100 without strip line (96.02 MHz). The filter module 300 with a single strip line on a multiple layers has a wider bandwidth of passband (98.22 MHz) than that of filter module 200 with a strip line on a single layer has a wider bandwidth of passband (95.32 MHz).

Figure 8B:
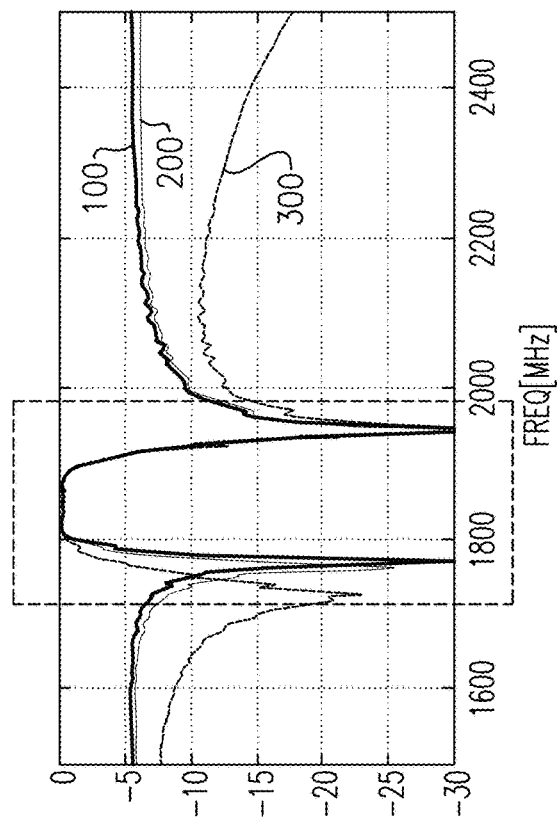
FIG. 8B is an enlarged graph of the dash-lined area of FIG. 8A.

FIG. 8B is an enlarged graph of dash-lined area of FIG. 8A. From FIG. 8B, the advantage of the filter module 300 with a single strip on multiple layers is more outstanding.

Figure 9:
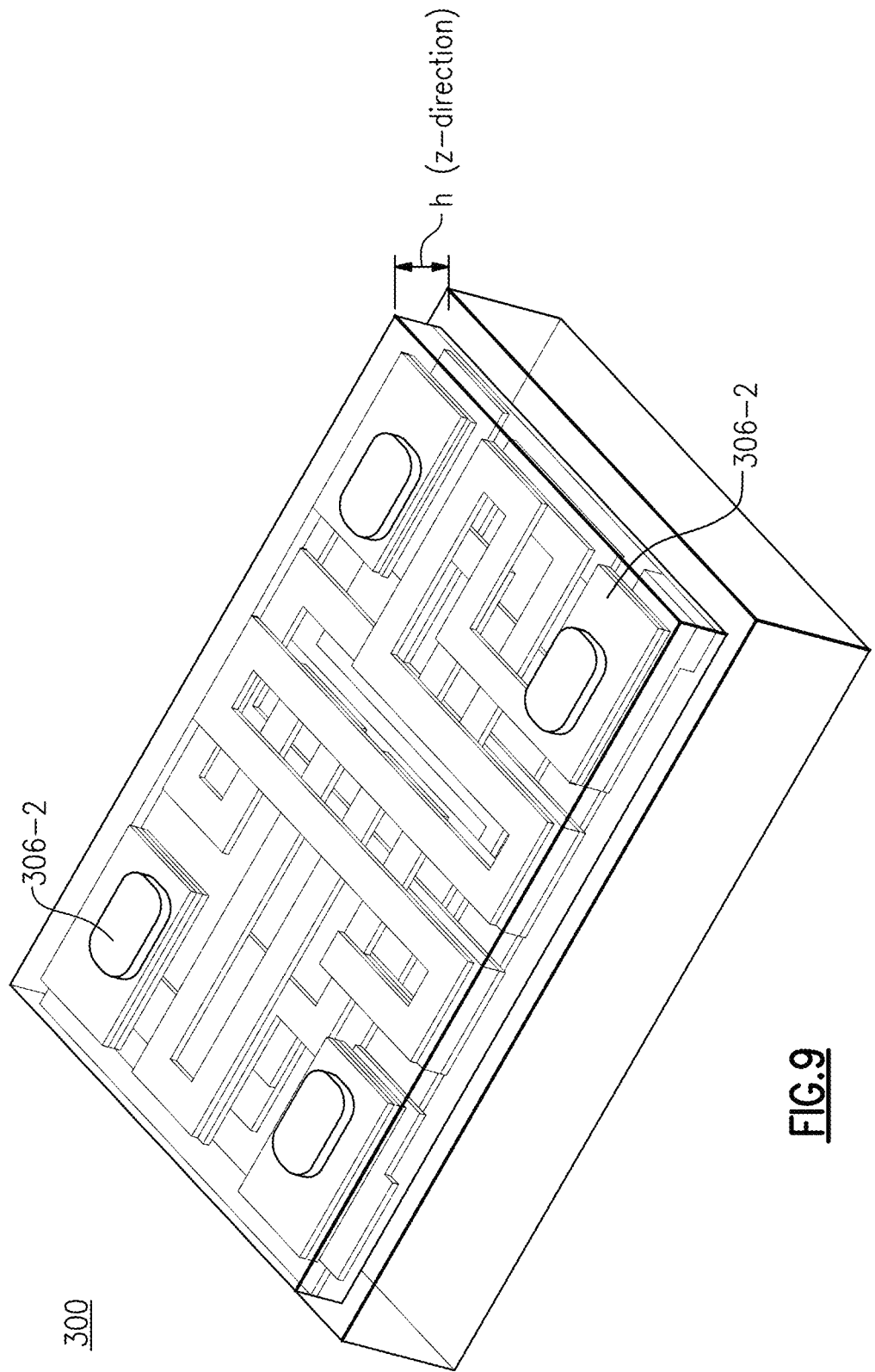
FIG. 9 is a schematic diagram represented in 3D view of the filter module with a single strip line on multiple layers.

FIG. 9 is a schematic diagram represented in 3D view of the filter module with a single strip line on multiple layers.

According to an embodiment, even the height (h, z direction) of the chip does not need to be extended. Therefore, the size of the chip can be maintained while the bandwidth of pass band of the filter module is enhanced.

Figure 10A:
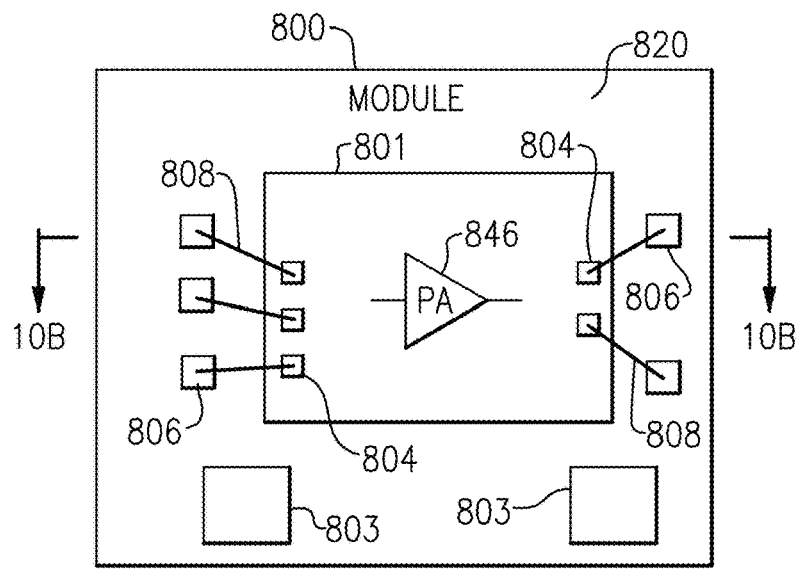
FIG. 10A is a schematic diagram of one embodiment of a packaged module.
Figure 10B:
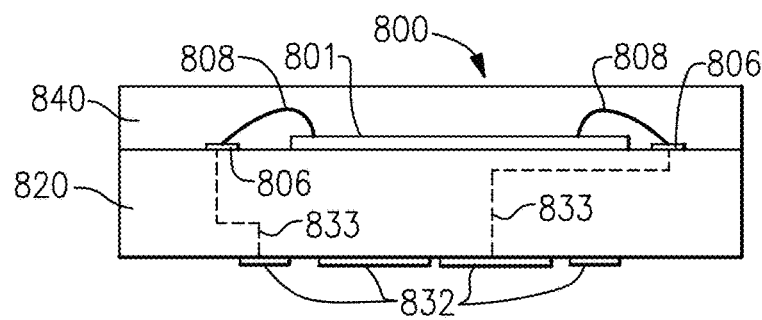
FIG. 10B is a schematic diagram of a cross-section of the packaged module of FIG. 10A taken along the lines 10B-10B.

FIG. 10A is a schematic diagram of one embodiment of a packaged module 800. FIG. 10B is a schematic diagram of a cross-section of the packaged module 800 of FIG. 10A taken along the lines 10B-10B.

The packaged module 800 includes an IC or die 801, surface mount components 803, wirebonds 808, a package substrate 820, and encapsulation structure 840. The package substrate 820 includes pads 806 formed from conductors disposed therein. Additionally, the die 801 includes pads 804, and the wirebonds 808 have been used to electrically connect the pads 804 of the die 801 to the pads 806 of the package substrate 801.

The die 801 includes a filter module, which can be implemented in accordance with any of the embodiments herein.

The packaging substrate 820 can be configured to receive a plurality of components such as the die 801 and the surface mount components 803, which can include, for example, surface mount capacitors and/or inductors.

As shown in FIG. 10B, the packaged module 800 is shown to include a plurality of contact pads 832 disposed on the side of the packaged module 800 opposite the side used to mount the die 801. Configuring the packaged module 800 in this manner can aid in connecting the packaged module 800 to a circuit board such as a phone board of a wireless device. The example contact pads 832 can be configured to provide RF signals, bias signals, power low voltage(s) and/or power high voltage(s) to the die 801 and/or the surface mount components 803. As shown in FIG. 10B, the electrically connections between the contact pads 832 and the die 801 can be facilitated by connections 833 through the package substrate 820. The connections 833 can represent electrical paths formed through the package substrate 820, such as connections associated with vias and conductors of a multilayer laminated package substrate.

In some embodiments, the packaged module 800 can also include one or more packaging structures to, for example, provide protection and/or facilitate handling of the packaged module 800. Such a packaging structure can include overmold or encapsulation structure 840 formed over the packaging substrate 820 and the components and die(s) disposed thereon.

It will be understood that although the packaged module 800 is described in the context of electrical connections based on wirebonds, one or more features of the present disclosure can also be implemented in other packaging configurations, including, for example, flip-chip configurations.

Figure 11:
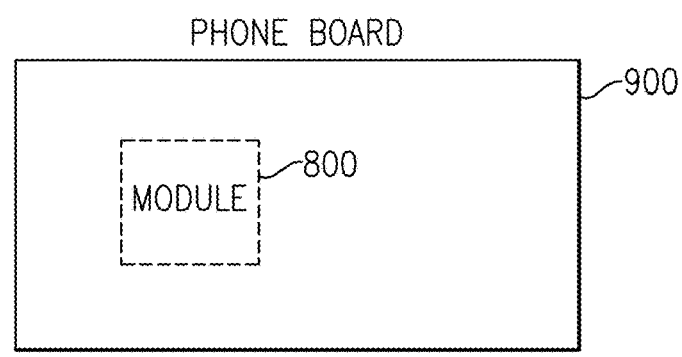
FIG. 11 is a schematic diagram of one embodiment of a phone board.

FIG. 11 is a schematic diagram of one embodiment of a phone board 900.

The phone board 900 includes the module 800 shown in FIGS. 10A-10B attached thereto. Although not illustrated in FIG. 11 for clarity, the phone board 800 can include additional components and structures.

Applications

Some of the embodiments described above have provided examples in connection with wireless devices or mobile phones. However, the principles and advantages of the embodiments can be used for any other systems or apparatus that have needs for filter modules.

Such filter modules can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A filter module comprising:
an input node;
an output node;
a filter disposed along a signal path extending from the input node to the output node;
a single strip line configured to generate an inductance between the filter and a ground such to increase a bandwidth of a passband of the filter module, the strip line disposed on multiple layers, each of the multiple layers defined by a plurality of pulse-shaped portions of the strip line disposed on a plane.

2. The filter module of claim 1 wherein one end of the strip line is connected to a first ground node and the other end of the strip line is connected to a second ground node, the first ground node and the second ground node having a voltage value of the ground.

3. The filter module of claim 1 wherein the strip line includes at least one connecting portion connecting one layer of the strip line with an adjacent layer of the strip line.

4. The filter module of claim 1 wherein the strip line is arranged such that at least a part of an outer boundary of the plurality of pulse-shaped portions is disposed in the vicinity of a frame of the filter module.

5. The filter module of claim 1 wherein each of the plurality of pulse-shaped portions of the strip line has a rectangular pulse shape.

6. The filter module of claim 1 wherein each of the plurality of pulse-shaped portions of the strip line has a curved pulse shape.

7. The filter module of claim 1 wherein the filter includes at least one series resonator and at least one shunt resonator disposed between the at least one series resonator and the ground.

8. The filter module of claim 7 wherein the inductance generated by the strip line is configured to increase difference between a resonance frequency and an anti-resonant frequency of the at least one series resonator or shunt resonator.

9. A radio frequency module comprising:
a packaging board configured to receive a plurality of components;
a filter assembly implemented on the packaging board, the filter assembly including: an input node; an output node; a filter disposed along a signal path extending from the input node to the output node; a single strip line configured to generate an inductance between the filter and a ground such to increase a bandwidth of a passband of the filter module, the strip line disposed on multiple layers, each of the multiple layers defined by a plurality of pulse-shaped portions of the strip line disposed on a plane.

10. The radio frequency module of claim 9 wherein the radio frequency module is a front-end module.

11. The radio frequency module of claim 9 wherein one end of the strip line is connected to a first ground node and the other end of the strip line is connected to a second ground node, the first ground node and the second ground node having a voltage value of the ground.

12. The radio frequency module of claim 9 wherein the strip line includes at least one connecting portion connecting one layer of the strip line with adjacent layer of the strip line.

13. The radio frequency module of claim 9 wherein the strip line is arranged such that at least a part of an outer boundary of the plurality of pulse-shaped portions is disposed in the vicinity of a frame of the filter module.

14. The radio frequency module of claim 9 wherein each of the plurality of pulse-shaped portions of the strip line has a rectangular pulse shape.

15. The radio frequency module of claim 9 wherein each of the plurality of pulse-shaped portions of the strip line has a curved pulse shape.

16. The radio frequency module of claim 9 wherein the filter includes at least one series resonator and at least one shunt resonator disposed between the at least one series resonator and the ground.

17. The radio frequency module of claim 16 wherein the inductance generated by the strip line is configured to increase difference between a resonance frequency and an anti-resonant frequency of the at least one series resonator or shunt resonator.

18. A mobile device comprising:
an antenna configured to receive a radio frequency signal; and
a front end system configured to communicate with the antenna, the front end system including a filter module including: an input node; an output node; a filter disposed along a signal path extending from the input node to the output node; a strip line configured to generate an inductance between the filter and a ground such to increase a bandwidth of a passband of the filter module, the single strip line disposed on multiple layers, each of the multiple layers defined by a plurality of pulse-shaped portions of the strip line disposed on a plane.

19. The mobile device of claim 18 wherein one end of the strip line is connected to a first ground node and the other end of the strip line is connected to a second ground node, the first ground node and the second ground node having a voltage value of the ground.

20. The mobile device of claim 18 wherein the strip line includes at least one connecting portion connecting one layer of the strip line with adjacent layer of the strip line.

21. The mobile device of claim 18 wherein the strip line is arranged such that at least a part of an outer boundary of the plurality of pulse-shaped portions is disposed in the vicinity of a frame of the filter module.

22. The mobile device of claim 18 wherein each of the plurality of pulse-shaped portions of the strip line has a rectangular pulse shape.

23. The mobile device of claim 18 wherein each of the plurality of pulse-shaped portions of the strip line has a curved pulse shape.

24. The mobile device of claim 18 wherein the filter includes at least one series resonator and at least one shunt resonator disposed between the at least one series resonator and the ground.

25. The mobile device of claim 24 wherein the inductance generated by the strip line is configured to increase difference between a resonance frequency and an anti-resonant frequency of the at least one series resonator or shunt resonator.

* * * * *